(12) United States Patent
Ota et al.

(10) Patent No.: US 7,215,257 B2
(45) Date of Patent: May 8, 2007

(54) DEPRESSION JUDGMENT DEVICE

(75) Inventors: Kazuyo Ota, Toyohashi (JP); Hideyuki Kihara, Zama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 360 days.

(21) Appl. No.: 10/505,553

(22) PCT Filed: Oct. 20, 2003

(86) PCT No.: PCT/JP03/13354

§ 371 (c)(1),
(2), (4) Date: Aug. 23, 2004

(87) PCT Pub. No.: WO2004/036403

PCT Pub. Date: Apr. 29, 2004

(65) Prior Publication Data

US 2005/0088323 A1 Apr. 28, 2005

(30) Foreign Application Priority Data

Oct. 18, 2002 (JP) .............................. 2002-304774

(51) Int. Cl.
*H03K 17/94* (2006.01)
(52) U.S. Cl. .............................. 341/22; 341/26; 710/67
(58) Field of Classification Search .................. 341/22, 341/26; 710/67
See application file for complete search history.

(56) References Cited

U.S. PATENT DOCUMENTS

| | | | |
|---|---|---|---|
| 5,220,323 A * | 6/1993 | Ito et al. ........................ 341/24 |
| 5,386,159 A | 1/1995 | Dupre | |
| 5,479,645 A | 12/1995 | Sakai et al. | |
| 5,832,206 A * | 11/1998 | De Jesus et al. ............... 726/23 |
| 5,929,790 A * | 7/1999 | Lim ............................. 341/22 |
| 6,028,538 A * | 2/2000 | Ramesh et al. ............... 341/24 |
| 6,520,699 B2 * | 2/2003 | Abe ............................ 400/485 |
| 6,532,499 B1 * | 3/2003 | Nakamura ..................... 710/1 |
| 6,563,434 B1 * | 5/2003 | Olodort et al. ............... 341/22 |

FOREIGN PATENT DOCUMENTS

| | | |
|---|---|---|
| JP | 61-133831 | 8/1986 |
| JP | 62-256018 A | 11/1987 |
| JP | 63-36324 | 2/1988 |

* cited by examiner

*Primary Examiner*—Timothy Edwards, Jr.
(74) *Attorney, Agent, or Firm*—McDermott Will & Emery LLP

(57) ABSTRACT

A depression-judgment apparatus which properly judges the ON/OFF of a key switch without being affected by chattering that occur when key switch is turned ON is provided. The depression-judgment apparatus of the present invention comprises a timer selector circuit capable of setting time from an outside, a depression-timer circuit for counting time by using the time set in the above-mentioned timer selector circuit as a cycle, a depression-memory section for inputting and memorizing information of whether the key switch is depressed or not when the above-mentioned depression-timer circuit is set for the predetermined value, and a depression-judgment circuit which judges that the above-mentioned key switch is depressed when the above-mentioned depression-memory section inputs the information n times (n is positive integer equal to or more than 2) or more in succession, that the above-mentioned key switch is depressed.

3 Claims, 3 Drawing Sheets

DEPRESSION JUDGMENT DEVICE

TECHNICAL FIELD

The present invention relates to a depression-judgment apparatus for detecting whether a key switch is depressed or not.

BACKGROUND ART

Many portable equipments, including cellular phones, has a key switch in the operating section. These portable equipments have a depression-judgment apparatus for detecting whether a key switch is depressed or not.

A depression-judgment apparatus of the conventional art will be described in reference to FIG. 3. FIG. 3 is a block diagram showing the configuration of a depression-judgment apparatus of the conventional art. In FIG. 3, a reference numeral 1 denotes a key switch, a reference numeral 300 denotes a depression-judgment apparatus and a reference numeral 8 denotes a central processing unit (hereinafter referred to as CPU). Depression-judgment apparatus 300 comprises a power supply terminal 3, an input terminal 4, a ground terminal 11, a resistor 12, a depression-judgment circuit 6 and an output terminal 7.

The operation of a depression-judgment apparatus of the conventional art configured as above-mentioned will hereinafter be described. In a depression-judgment apparatus of the conventional art, input terminal 4 becomes high level when key switch 1 is in OFF status, and depression-judgment circuit 6 (for example, comprised of flip-flops) would not operate, outputting low level from output terminal 7. Furthermore, when key switch 1 is in ON status, input terminal 4 becomes low level, and depression-judgment circuit 6 operates and detects that a key switch is depressed, outputting a high level from output terminal 7 so as to inform depression. As mentioned above, in a case where key switch 1 is depressed and hence changes from OFF to ON, input terminal 4 changes from high level to low level, and output terminal 7 of depression-judgment circuit 6 changes from low level to high level.

Depressed key detecting method in accordance with patent document 1 detects chattering characteristics which varies due to differences in intensity of key depressions.

However, in the conventional configuration, chattering occurs when key switch 1 is depressed and changed from OFF to ON, and input terminal 4 thereby changes from low level to high level. Since the level of input terminal 4 would not settle due to chattering, the conventional apparatus had a problem in which depression-judgment circuit 6 does not properly detect that key switch 1 is depressed, and hence depression-judgment apparatus cannot conduct a proper depression-judgment.

The present invention purports to solve the above-mentioned conventional problems, and aims to provide a depression-judgment apparatus which properly judges the ON/OFF of a key switch without being affected by chattering that occurs when key switch is turned ON.

The present invention aims to provide a depression-judgment apparatus having a still lower power consumption.

The present invention aims to provide a depression-judgment apparatus capable of setting a key switch detection cycle from an outside, corresponding to key switch characteristics and/or key switch detection velocity which is required.

DISCLOSURE OF INVENTION

In order to achieve this purpose, the depression-judgment apparatus of the present invention has the following configuration.

A depression-judgment apparatus in accordance with the present invention from one aspect comprises a timer selecting circuit capable of setting a period of time from an outside thereof, a depression-timer circuit for counting a span of time by taking the period of time set in the above-mentioned timer selecting circuit as a cycle, a depression-memory section for inputting and memorizing information of whether the key switch is depressed or not on a condition that the above-mentioned depression-timer circuit is set for the predetermined value, and a depression-judgment circuit which judges that the above-mentioned key switch has been depressed when the above-mentioned depression-memory section inputs the information successively n times (n is positive integer equal to or more than 2) or more.

The above-mentioned depression-judgment apparatus in accordance with the present invention from another aspect further comprises a switch circuit which electrically conducts an electrical current from the power supply to the key switch, during a predetermined period that is determined responding to an output value of the above-mentioned depression-timer circuit and that includes a period of time when the depression-memory section inputs the information whether the above-mentioned key switch is depressed or not, and interrupts the above-mentioned electrical current flows during other periods.

A depression-judgment apparatus in accordance with the present invention from another aspect comprises at least one key switch, the above-mentioned depression-judgment apparatus, and a central processing unit which sets the time in the above-mentioned timer selecting circuit and receives the judgment result of the above-mentioned depression-judgment circuit.

According to the present invention, an advantageous effect capable of realizing a depression-judgment apparatus which properly judges the ON/OFF of a key switch without being affected by chattering that occur when key switch is turned ON.

According to the present invention, an advantageous effect capable of realizing a depression-judgment apparatus having a still lower power consumption.

According to the present invention, an advantageous effect capable of realizing a depression-judgment apparatus which can set a key switch detection cycle from an outside, corresponding to key switch characteristics and/or key switch detection velocity which is required, and the like.

While the novel features of the invention are set forth particularly in the appended claims, the invention, both as to organization and content, will be better understood and appreciated, along with other objects and features thereof, from the following detailed description taken in conjunction with the drawings.

Part or all of the drawings are drawn schematically for diagrammatic representation and it should be considered that they do not necessarily reflect relative size and position of components shown therein.

BEST MODE FOR CARRYING OUT THE INVENTION

Embodiments that specifically show the best mode for conducting the present invention will be described below with reference to figures.

Figure 1:
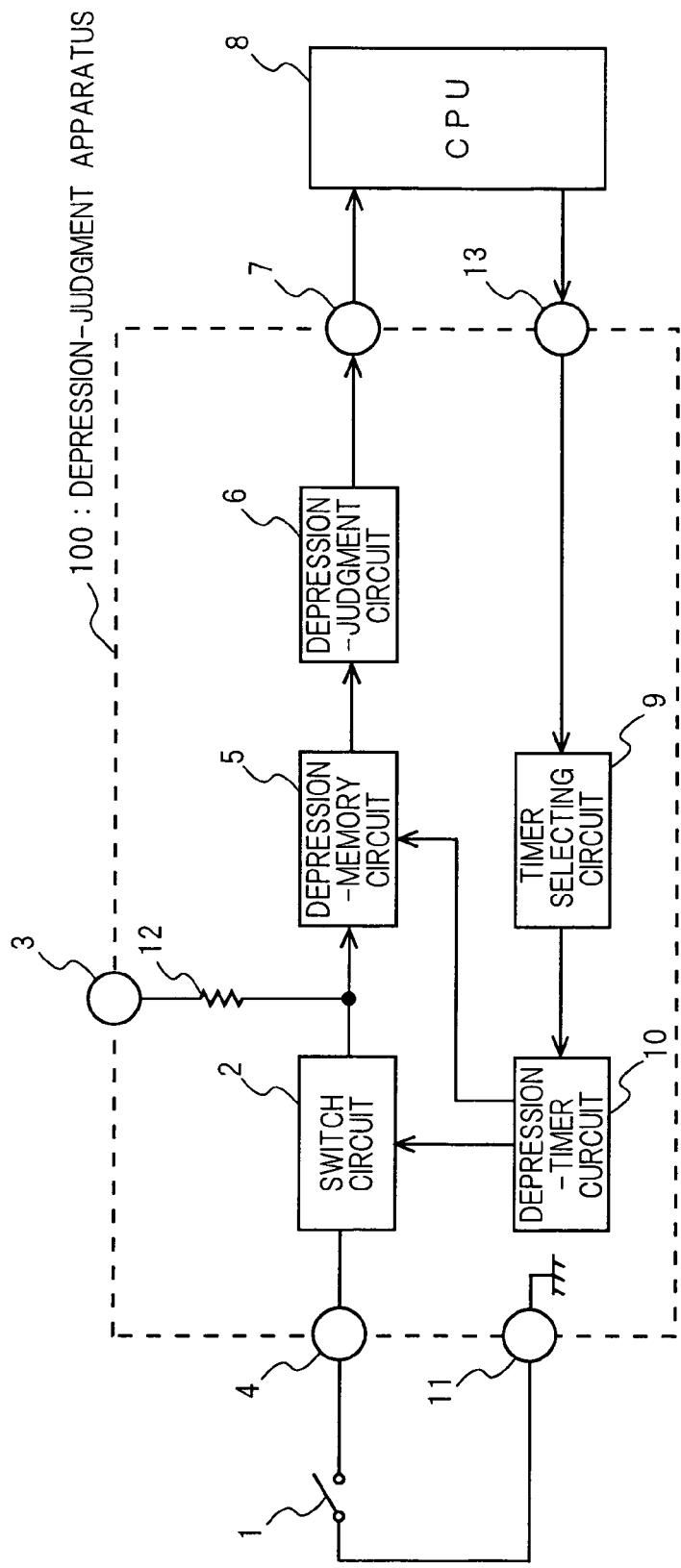
FIG. 1 is a block diagram showing the configuration of a depression-judgment apparatus in accordance with the embodiment of the present invention.

The depression-judgment apparatus in accordance with the embodiment of the present invention will be described with reference to FIG. 1 and FIG. 2. FIG. 1 is a block diagram showing the configuration of a depression-judgment apparatus in accordance with the embodiment of the present invention. In FIG. 1, a reference numeral 1 denotes a key switch, a reference numeral 100 denotes a depression-judgment apparatus, and a reference numeral 8 denotes a CPU. Depression-judgment apparatus 100 comprises an input terminal 4, a ground terminal 11, a power supply terminal 3, a switch circuit 2, a resistor 12, a depression-memory section 5, a depression-judgment circuit 6, an output terminal 7, a timer selector input terminal 13, a timer selector circuit 9 and a depression-timer circuit 10. Depression-judgment apparatus 100 is configured on a single integrated circuit (IC). Depression-judgment apparatus 100 may be configured on a same semiconductor chip as the CPU 8 as a peripheral circuit.

Figure 2:
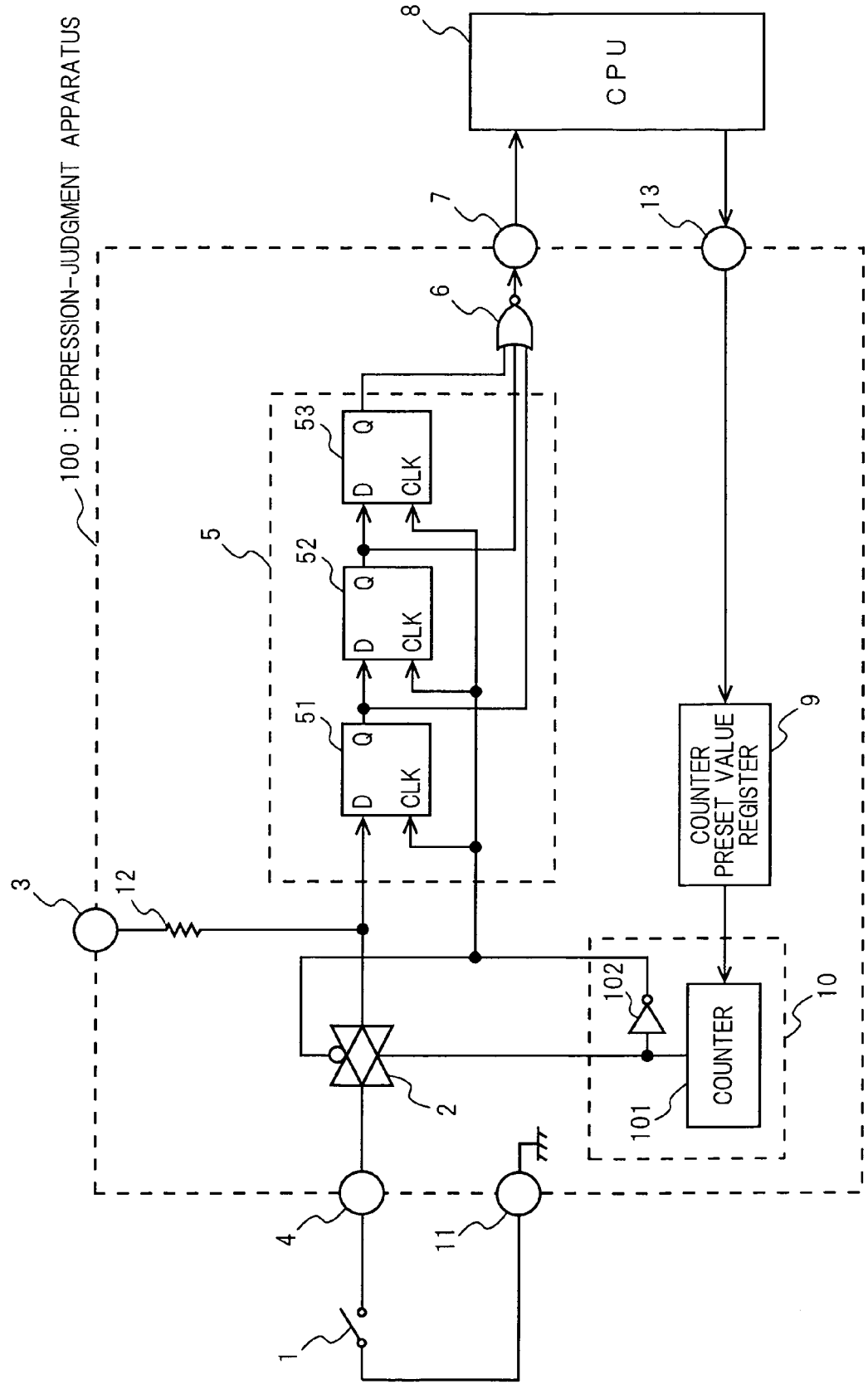
FIG. 2 is a schematic circuit diagram showing the configuration of a depression-judgment apparatus in accordance with the embodiment of the present invention.
Figure 3:
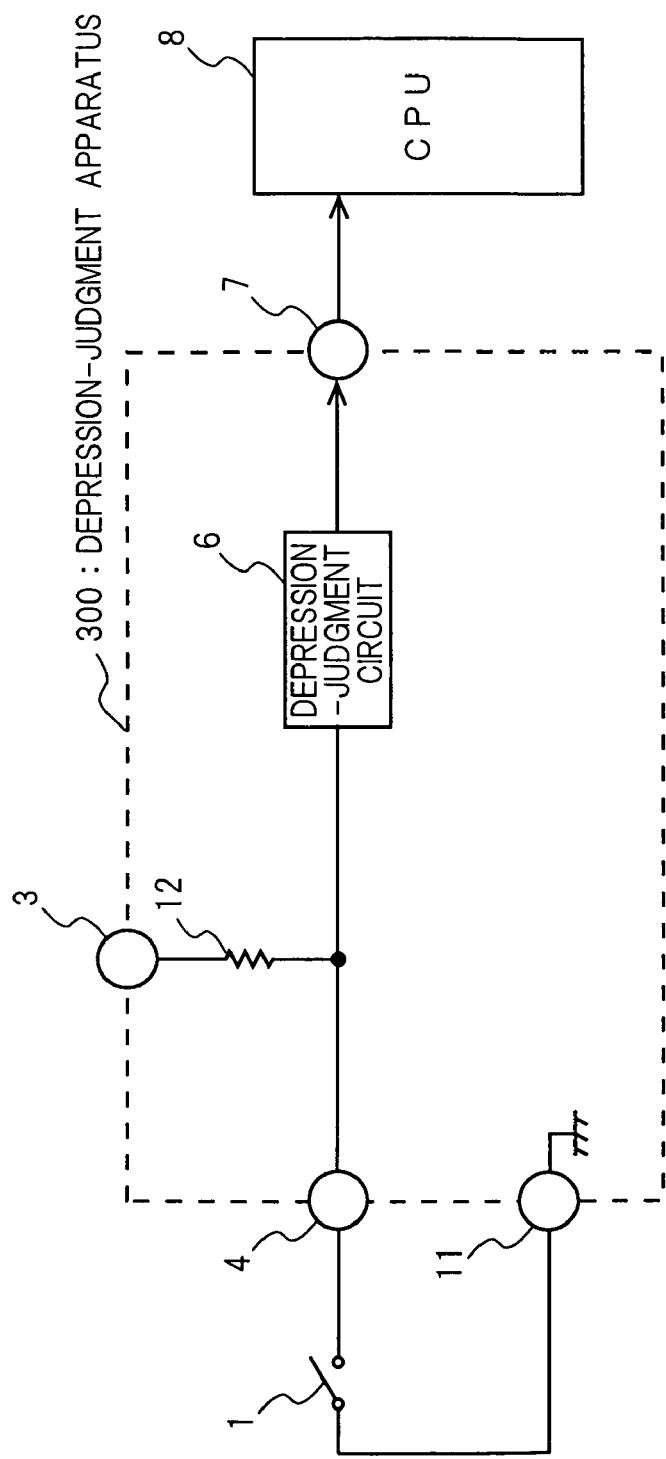
FIG. 3 is a block diagram showing the configuration of a depression-judgment apparatus in accordance with the conventional art.

FIG. 2 is a schematic circuit diagram specifically showing the configuration of a depression-judgment apparatus in accordance with the embodiment of the present invention. FIG. 1 and FIG. 2 shows the same depression-judgment apparatus, and a same reference numeral is appended to the same block (circuit).

Timer selector circuit 9 is a counter preset value register. CPU 8 sets a predetermined time to a counter preset value register through timer setting input terminal 13. An arbitrary time can be set to the counter preset value register.

Depression-timer circuit 10 comprises a counter 101 and an inverter 102. Counter 101 counts the time by using the set value of the counter preset value register as a cycle, and outputs high level for a predetermined period (refers to as "the first period") within the cycle. Inverter 102 inverts the output signal of counter 101.

Key switch 1 is attached to an operation panel of an arbitrary electronic apparatus in such a manner that a user can depress the key switch. Switch circuit 2 is an analog switch combining an NMOS transistor and a PMOS transistor. Switch circuit 2 may be an NMOS transistor or a PMOS. Switch circuit 2 inputs the output signal of counter 101 and its inverted signal, and electrically conducts the path over which current flows from power supply terminal 3 to key switch 1 through resistor 12 during the first period, but interrupts that path during other periods.

Generally, when a key switch is used over a long time, non-conductive impurities adheres to the contact, and conductive characteristics of the contact deteriorates. In order to ensure the reliability of the contact of a key switch even when conductive characteristics of the contact is in a deteriorated status to some extent, there is a need to feed a predetermined amount of current or more to the key switch when the key switch is turned ON. In comparison with the current consumption of a semiconductor apparatus made to have low power consumption, the current to be fed into a key switch is by far larger. By effectually reducing the current that flows into key switch 1 with the above-mentioned configuration, power consumption of the entire electronic apparatus can be reduced significantly.

Depression-memory 5 is a serial shift register consisting of three D-flip-flops 51 to 53. D-flip-flops 51 to 53 sequentially inputs the electric potentials of the junction points between switch circuit 2 and resistor 12 to the data input terminal D, and inputs the inverted signal of an output signal of counter 101 to the clock input terminal CLK. D-flip-flops 51 to 53 sequentially memorizes the electric potentials of the junction points between switch circuit 2 and resistor 12 (low level when key switch 1 is depressed, and high level when key switch is not depressed) at the end of the first cycle. D-flip-flops 51 to 53 outputs the output signals from output terminal Q respectively, and transmits to 3-Input NOR Gate 6. In the embodiment, depression-memory section 5 has three D-flip-flops 51 to 53 (three-stage serial shift register). Depression-memory 5 may have an n-stage (n is positive integer equal to or more than 2) serial shift register.

The timing for inputting the information as to whether the key switch is depressed or not, is substantially included in the first period.

Depression-judgment circuit 6 is a 3-Input NOR Gate 6 which inputs the output signals of D-flip-flops 51 to 53. Depression-judgment circuit 6 outputs high level in a case where all the output signals of the three D-flip-flops 51 to 53 are low levels (in a case where key switch is depressed in succession during the first cycle for three times), and outputs a low level at other cases.

CPU 8 inputs the output signal of 3-Input NOR Gate (judgment result of depression-judgment circuit 6) through output terminal 7, and when output signal is low level, the CPU judges that key switch 1 is depressed and conducts the predetermined process.

Depression-judgment circuit 6 may judge that key switch 1 is depressed in a case where depression-memory section 5 is configured with RAM (random access memory) and a key switch is in a depressed status successively during the first period for an arbitrary number of times (n is not a fixed value of 3, and can be set arbitrarily) which CPU 8 sets.

The operation of a depression-judgment apparatus configured as above-mentioned will be described. As an initial value, key switch 1 is assumed as in OFF status. In that status, depression-timer circuit 10 operates by using the time which CPU 8 set to timer selector circuit 9 as a cycle. In the first period of each cycle, switch circuit 2 becomes an electronically conducted status, but becomes an interrupted status during other periods. In the first embodiment, the first period is a period of a single clock (clock is a clock built into counter 101 of depression-timer circuit 10). Depression-timer circuit 10 makes the switch circuit 2 turn ON for a single clock period in every predetermined cycle, and makes the switch circuit turn OFF during other times. Such switch operation is repeated. The information as to whether key switch 1 is ON or OFF (in the embodiment, information of low level in the case where key switch 1 is ON, and information of high level in the case where key switch 1 is OFF) when switch circuit 2 is turned ON, is memorized in depression-memory section 5. Since key switch 1 is in OFF status at this point, when switch circuit 2 is turned ON, input terminal 4 is pulled up to power supply terminal 3 by resistor 12, and input terminal 4 becomes high level. Depression-memory section 5 memorizes a value of high level (information that key switch 1 is not ON). Depression-judgment circuit 6 inputs the three output signals of depression-memory section 5, and outputs an output signal of low level.

Subsequently, key switch 1 is assumed as becoming an ON status. In a case where key switch 1 is depressed and becomes an ON status, input terminal 4 which was pulled up to power supply terminal 3 by resistor 12 when switch circuit 2 is turned ON changes from high level to low level. In this status, depression-memory section 5 memorizes information that key switch 1 is depressed. In a status where switch circuit 2 is OFF, input terminal of depression-memory section 5 becomes high level. Input terminal of depression-memory section 5 changes from high level to low level whenever switch circuit 2 turns ON. Depression-memory section 5 memorizes a value of low level (information that key switch 1 is ON) at the end of the first period.

In a case where depression-memory section 5 memorizes a value of low level (information that key switch 1 is ON) in succession during the first period for three times, depression-judgment circuit 6 outputs an output signal of high level.

In a case where switch circuit 2 that is controlled by depression-timer circuit 10 is in an OFF status, current hardly flows in resistor 12 even when key switch 1 is depressed. Herewith, depression-judgment circuit 100 has an extremely low power consumption. By setting time in timer selector circuit 9 from an outside (for example, CPU 8), the interval (cycle) of ON time of switch circuit 2 can be changed.

Hence it follows that according to the present embodiment, a depression-judgment apparatus which properly judges the ON/OFF of a key switch without being affected by chattering that occur when key switch is turned ON can be realized. A depression-judgment apparatus having a still lower power consumption can be realized. A depression-judgment apparatus which can set a key switch detection cycle from an outside, corresponding to key switch characteristics, key switch detection velocity which is required, and the like can be realized.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

INDUSTRIAL APPLICABILITY

The depression-judgment apparatus of the present invention is useful, for example as a depression-judgment apparatus for an arbitrary electronic apparatus. The depression-judgment apparatus is particularly useful as a depression-judgment apparatus for a battery-drived portable apparatus (for example, a cellular phone).

The invention claimed is:

1. A depression-judgment apparatus comprising:
   a timer selecting circuit capable of setting a period of time based on a signal input from outside said depression-judgment apparatus, said signal input by a CPU;
   a depression-timer circuit for counting a span of time by taking the period of time set in said timer selecting circuit as a cycle;
   a depression-memory section for inputting and memorizing information of whether the key switch is depressed or not on a condition that said depression-timer circuit is set for the predetermined value; and
   a depression-judgment circuit which judges that said key switch has been depressed when said depression-memory section inputs the information successively n times (n is positive integer equal to or more than 2) or more.

2. The depression-judgment apparatus in accordance with claim 1 further comprising a switch circuit which electrically conducts an electrical current from the power supply to the key switch, during a predetermined period that is determined responding to an output value of said depression-timer circuit and that includes a period of time when the depression-memory section inputs the information whether said key switch is depressed or not, and interrupts said electrical current flows during other periods.

3. The depression-judgment apparatus comprising:
   at least one key switch,
   said depression-judgment apparatus in accordance with claim 1 or claim 2, and
   a central processing unit which sets the time in said timer selecting circuit and receives the judgment result of said depression-judgment circuit.

* * * * *

UNITED STATES PATENT AND TRADEMARK OFFICE
CERTIFICATE OF CORRECTION

| | | |
|---|---|---|
| PATENT NO. | : 7,215,257 B2 | Page 1 of 1 |
| APPLICATION NO. | : 10/505553 | |
| DATED | : May 8, 2007 | |
| INVENTOR(S) | : Kazuyo Ota et al. | |

It is certified that error appears in the above-identified patent and that said Letters Patent is hereby corrected as shown below:

On the title page of the Letters Patent,

Under section "(56) References cited, FOREIGN PATENT DOCUMENTS",
add, -- JP   5-29943 A  2/1993 --

Signed and Sealed this

Eighteenth Day of September, 2007

JON W. DUDAS
*Director of the United States Patent and Trademark Office*